United States Patent [19]

Gardiner et al.

[11] Patent Number: 4,575,649

[45] Date of Patent: Mar. 11, 1986

[54] RMS CONVERTERS

[75] Inventors: William H. Gardiner, Bath; Geoffrey A. Luckhurst, Yately, both of United Kingdom

[73] Assignee: Schlumberger Electronics (U.K.) Limited, Farnborough, England

[21] Appl. No.: 632,365

[22] Filed: Jul. 19, 1984

[30] Foreign Application Priority Data

Jul. 23, 1983 [GB] United Kingdom ................ 8319911

[51] Int. Cl.[4] ......................... H03K 5/00; G06G 7/24

[52] U.S. Cl. .................................... 307/492; 307/499; 307/262; 307/219; 328/26; 328/145

[58] Field of Search ............... 307/219, 494, 495, 499, 307/501, 262, 260, 261, 492; 328/26, 144, 145; 363/127

[56] References Cited

U.S. PATENT DOCUMENTS 4,097,767 6/1978 Blackmer et al. .................. 307/229

4,109,165 8/1978 Katakura et al. .................. 307/229

*Primary Examiner*—Stanley D. Miller

*Assistant Examiner*—Richard Roseen

*Attorney, Agent, or Firm*—Dale Gaudier

[57] ABSTRACT

An RMS converter has first and second transistors (40*a* and 42*a*) providing a signal representing double the log of the input voltage, a third transistor (40*b*), matched with the first (40*a*), providing a signal representative of the log of the output voltage and a fourth transistor (42*b*), matched with the second (42*a*) providing a signal representative of the anti-log of the ratio of those signals; the transistors in each matched pair are repetitively interchanged functionally thereby reducing errors caused by slight differences in the transistor operating characteristics.

6 Claims, 4 Drawing Figures

RMS CONVERTERS

This invention relates to RMS converters, that is to say to circuits for producing a d.c. signal whose magnitude is indicative of the RMS value of a d.c. or varying quantity, for example a sinusoidal waveform.

One known form of RMS converter uses the logarithmic small-signal voltage/current characteristic of a forward-biassed p-n semiconductor junction. The input waveform whose RMS value is to be measured is rectified and applied across two series p-n junctions, thereby generating a voltage $V_i$ proportional to twice the logarithm of the input waveform voltage. This voltage $V_i$ and a voltage $V_o$ proportional to the logarithm of the converter output voltage, generated in a similar manner using a single p-n junction, are used to control a fourth p-n junction, yielding a signal proportional to the anti-logarithm of the difference between $V_i$ and $V_o$. This signal is averaged to produce the converter output voltage, representative of the RMS value of the input waveform.

This circuit is intended to be implemented using matched pairs of transistors manufactured using integrated circuit techniques. However, it has been found that, even so, slight differences in characteristics between the transistors in a pair result in gain errors and hence inaccuracy.

According to one aspect of this invention there is provided an RMS converter comprising:

- first differential amplifier means arranged to receive a varying waveform at its inverting input;
- a feedback circuit, comprising first and second transistors with their collector-emitter paths in series, said first transistor being connected to the output and said second transistor being connected to the inverting input of said first amplifier means;
- averaging means;
- third transistor means having its collector-emitter path coupled between the output of said first amplifier means and the input of said averaging means;
- second differential amplifier means arranged to receive the output signal of said averaging means at its inverting input and havings its output coupled to the base of said third transistor means;
- and fourth transistor means having its collector-emitter path coupled between the inverting input and the output of said second amplifier means;
- whereby the output signal of said averaging means is representative of the RMS value of said varying waveform;
- and wherein switch means is arranged to interchange repetitively selected connections of said first and third transistor means respectively, and of said second and fourth transistor means respectively, whereby errors induced by differences in operating characteristics of said transistor means are reduced.

An RMS converter in accordance with this invention will now be described, by way of example, with reference to the accompanying drawings, in which.

Figure 1:
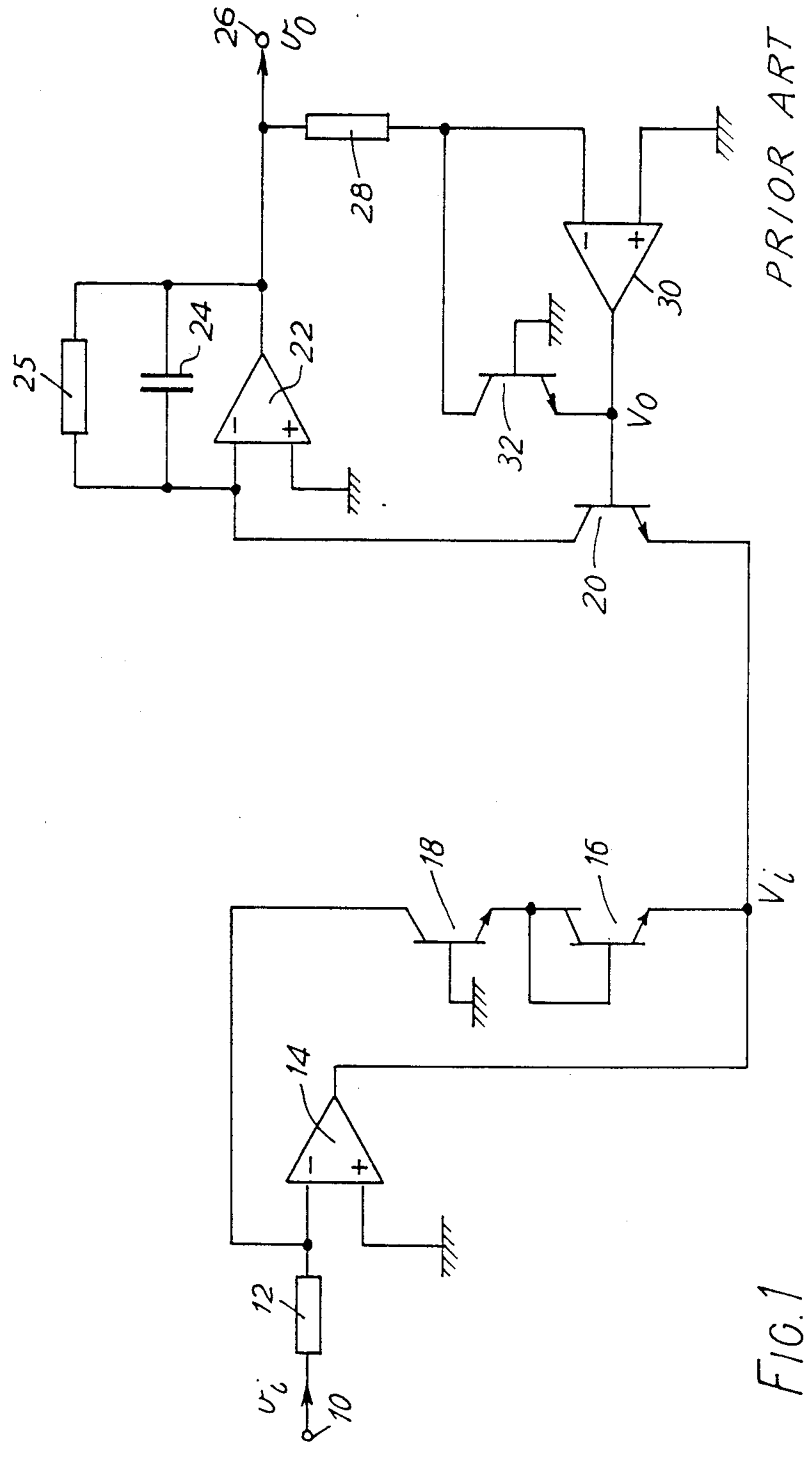
PRIOR ART FIG. 1
FIG. 1 is a circuit diagram of a known form of RMS converter.

Referring to FIG. 1, an RMS converter has an input terminal 10 intended to receive a rectified waveform whose RMS value is to be measured. The input 10 is coupled by a resistor 12 to the inverting input of an operational amplifier 14, the non-inverting input of which is grounded. The output of the amplifier 14 is connected to the emitter of a first transistor 16, the base and collector of which are connected together and to the emitter of a second transistor 18. The base of this transistor 18 is grounded, and its collector is connected to the non-inverting input of the amplifier 14.

The output of the amplifier 14 is also connected to the emitter of a third transistor 20, the collector of which is connected to the inverting input of an operational amplifier 22 having a feedback capacitor 24 and resistor 25 to form a low-pass filter. The output of the amplifier 22 supplies the output signal of the RMS converter at an output terminal 26, and is also fed back via a resistor 28 to the inverting input of an operational amplifier 30. The output of this amplifier 30 is connected to the base of the third transistor 20, and to the emitter of a fourth transistor 32, whose base is grounded and whose collector is connected to the inverting input of the amplifier 30.

In operation, the rectified input waveform is applied via the resistor 12 to the amplifier 14, causing an output current I to flow from the amplifier 14 through the base-emitter junctions of the transistors 16 and 18. The magnitude of this current is given by the equation for the small-signal forward-bias characteristic of a p-n junction:

$$I = I_s(e^{qV/kT} - 1) \quad (1)$$

where $I_s$ is the reverse saturation current;
q is the charge on an electron;
V is the voltage across the junction;
k is Boltzmann's constant; and
T is the absolute temperature.

Taking the logarithm of each side of equation 1 (and ignoring the factor of unity), and solving for V gives $$V = kT/q \log (I/I_s) \quad (2)$$

for each p-n junction.

The current I is directly related by the amplifier gain to the input current to the amplifier 14, and this current is in turn directly related by the input impedance to the input voltage $v_i$. Also k,T,q, and $I_s$ can be taken as constant, so for each p-n junction $$V \propto \log v_i \quad (3)$$

Thus the voltage V across each of the two base-emitter junctions is proportional to the logarithm of the input voltage $v_i$, and the voltage $V_i$ at the amplifier output is equal to their sum:

$$V_i \propto 2 \cdot \log v_i \quad (4)$$

The d.c. output voltage $v_o$ of the circuit, produced by the low-pass filter amplifier 22 at the terminal 26, causes a corresponding current to flow through the resistor 28 towards the virtual earth at the input of the amplifier 30. This current in turn causes current to flow from the output of the amplifier 30 through the base-emitter junction of the fourth transistor 32. By analogy to the analysis given above, the voltage $V_o$ at the amplifier output is proportional to the logarithm of the voltage $v_o$:

$$V_o \propto \log v_o \quad (5)$$

Thus the third transistor 20 has a voltage across its base-emitter junction $$(V_i - V_o) \propto 2 \log v_i - \log v_o = \log v_i^2/v_o \quad (6)$$

Recalling equation 1, the current conducted by the third transistor 20 is related to the exponential of the voltage across the junction, that is $$\exp(\log v_i^2/v_o) = v_i^2/v_o \quad (7)$$

and this current is low-pass filtered (that is, averaged) by the amplifier 22 and feedback capacitor 24 and resistor 25 to produce the d.c. output voltage $v_o$.
Thus $$v_o \propto \overline{(v_i^2/v_o)} = \overline{v_i^2}/v_o$$

so $$v_o^2 \propto \overline{v_i^2}$$

and $$v_o \propto \sqrt{\overline{v_i^2}}$$

that is, the output voltage $v_o$ is proportional to the RMS of the input voltage $v_i$.

The above analysis assumes that the operating characteristics of the transistors 16, 18, 20 and 32 are identical. In practice this ideal can be approximated by using pairs of matched transistors manufactured together by integrated circuit techniques and mounted in a common housing. However, even then there remain slight differences in the small-signal characteristic of each transistor, leading to gain errors in the circuit as a whole.

Figure 2:
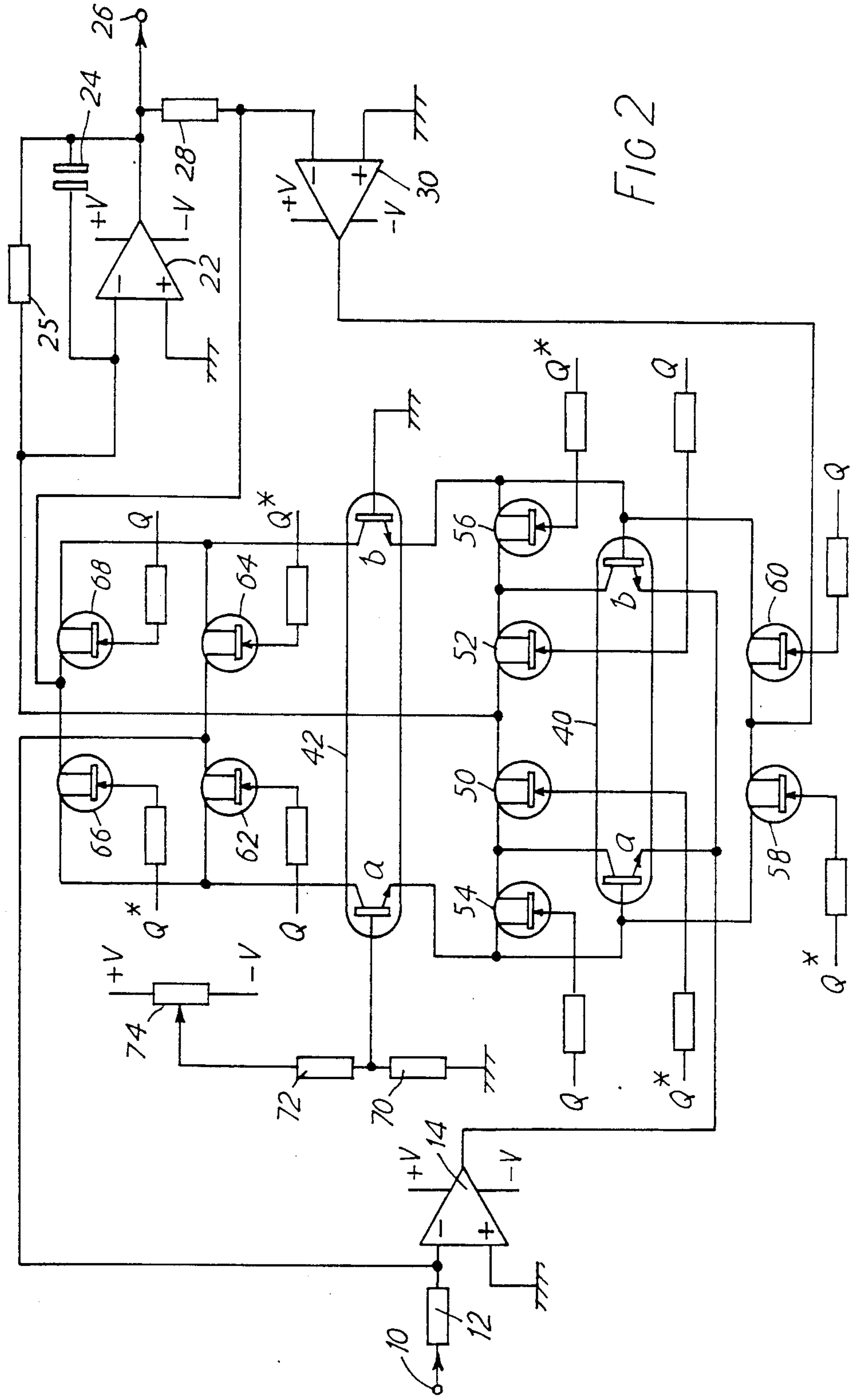
FIG. 2 is a circuit diagram of an RMS converter according to this invention.

A circuit to alleviate this problem is shown in FIG. 2, in which parts corresponding to those in FIG. 1 have corresponding reference numerals.

Referring to FIG. 2, the first and third transistors 16 and 20 comprise a matched pair of transistors 40*a* and 40*b*, and the second and fourth transistors 18 and 32 likewise comprise a matched pair 42*a* and 42*b*.

The emitters of the matched pair 40*a* and 40*b* are directly connected to the output of the amplifier 14. Their collectors are connected on the one hand via respective field-effect transistors (FETs) 50 and 52 to the input of the low-pass filter amplifier 22, and on the other hand via respective FETs 54 and 56 to their own bases. These bases are in turn connected directly to the emitters of the matched pair of transistors 42*a* and 42*b* respectively, and via respective FETs 58 and 60 to the output of the amplifier 30.

The collectors of the matched pair of transistors 42*a* and 42*b* are connected on the one hand via respective FETs 62 and 64 to the input of the amplifier 14, and on the other hand via respective FETs 66 and 68 to the input of the amplifier 30. The base of the transistor 42*b* is grounded, while that of the transistor 42*a* is coupled to a potential divider comprising two resistors 70 and 72. These resistors are connected between ground and the slider of a variable resistor 74 connected between positive and negative voltages +V and −V which are also supplied to the amplifiers 14, 22 and 30.

The gates of the FETs 52, 54, 60, 62 and 68 are connected via respective series resistors to receive a 10 Hz square wave Q from an oscillator (not shown). Likewise the gates of the FETs 50, 56, 58, 64 and 66 are connected via respective series resistors to receive a 10 Hz square wave Q* in anti-phase to the signal Q.

The operation of the circuit can be conveniently explained with reference to FIGS. 3 and 4, which illustrate the effective interconnections in the circuit when the Q and Q* signals respectively are at a high voltage level, thereby energising the associated FETs so that they switch to a low resistance state. The unenergised, very high resistance, FETs are indicated by broken connecting lines.

Figure 3:
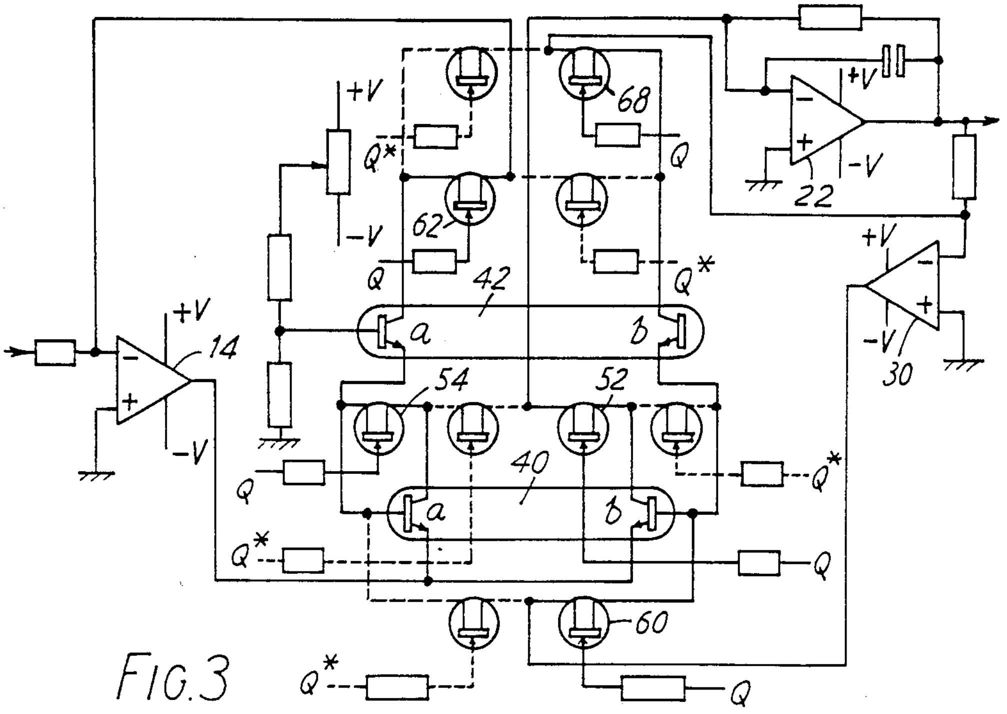
FIGS. 3 and 4 are modifications of FIG. 2 to illustrate the operation of the converter.

Thus, as shown in FIG. 3, when the Q signal is at a high voltage, the FETs 52, 54, 60, 62 and 68 are energised, connecting the collector of the transistor 40*b* to the amplifier 22, the collector of the transistor 40*a* to its base, the base of the transistor 40*b* to the output of the amplifier 30, the collector of the transistor 42*a* to the amplifier 14 and the collector of the transistor 42*b* to the input of the amplifier 30. In these circumstances, the interconnections of the circuit are directly comparable to those in FIG. 1, with the transistors 40*a*, 42*a*, 40*b* and 42*b* performing the functions of the transistors 16, 18, 20 and 32 respectively of FIG. 1.

Figure 4:
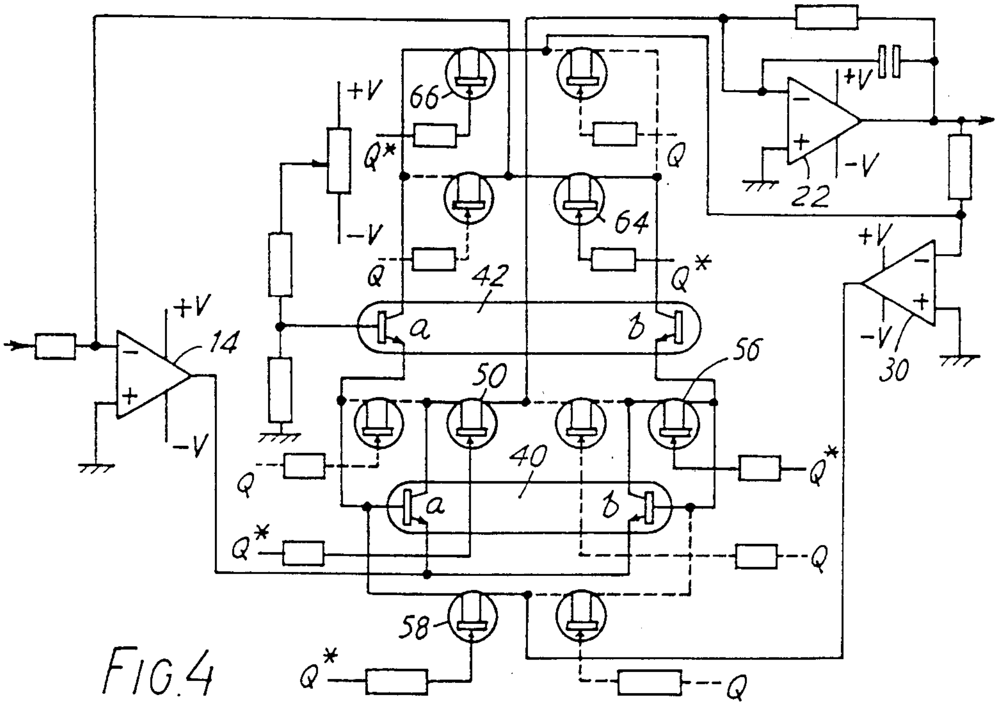

Conversely, as shown in FIG. 4, when the Q* signal is at a high voltage, the FETs 50, 56, 58, 64 and 66 are energised, connecting the collector of the transistor 40*a* to the amplifier 22, the collector of the transistor 40*b* to its base, the base of the transistor 40*a* to the output of the amplifier 30, the collector of the transistor 42*b* to the amplifier 14 and the collector of the transistor 42*a* to the input of the amplifier 30. Thus the transistors 40*a* and 42*a* are effectively interchanged with the transistors 40*b* and 42*b*, so that the functions of the transistors 16, 18, 20 and 32 of FIG. 1 are performed by the transistors 40*b*, 42*b*, 40*a* and 42*a*.

It has been found that the result of this repetitive interchange in functions of the transistors in each pair 40*a*, 40*b* and 42*a*, 42*b* is a reduction in the effect of any disparity in their operating characteristics. Consequently the long-term accuracy of the circuit is improved. Interchanging the transistor functions in this way is possible because the transistors in each pair have certain critical common connections, switching of which is thus not needed and would in fact degrade the circuit operation.

A slow switching rate, of the order of 10 Hz, is preferred. For use with an analogue-to-digital converter, the switching signals Q and Q* are preferably synchronised with the measurement cycle of the converter, to reduce noise and modulation errors.

The variable resistor 74 is adjusted to provide an initial balance in the operation of the circuit, to reduce the effects of demodulation, beating and noise.

We claim:

1. An RMS converter comprising:

first differential amplifier means having an output and arranged to receive a varying waveform at an inverting input;

a feedback circuit, comprising first and second transistors with their collector-emitter paths in series, said first transistor being connected to the output of said first amplifier means and said second transistor being connected to the inverting input of said first amplifier means;

averaging means having an input, said averaging means producing an output signal;

third transistor means having a base and having its collector-emitter path coupled between the output of said first amplifier means and the input of said averaging means;

second differential amplifier means arranged coupled to receive the output signal of said averaging means at an inverting input and having an output coupled to the base of said third transistor means;

and fourth transistor means having its collector-emitter path coupled between the inverting input and the output of said second amplifier means;

whereby the output signal of said averaging means is representative of the RMS conversion of said varying waveform;

and wherein switch means is coupled to said first, second, third and fourth transistor means to alternately and repetitively interchange selected connections of said first and third transistor means respective, and of said second and fourth transistor means respectively so that the first transistor means and the third transistor means are connected as above, or the first transistor means is alternatively connected as the third transistor means was and the third transistor means is alternatively connected as the first transistor means was, whereby errors induced by differences in operating characteristics of said first and third transistor means and said second and fourth transistor means are reduced.

2. An RMS converter as claimed in claim 1 and wherein the first and third transistors and the second and fourth transistors respectively are chosen to have matched characteristics.

3. An RMS converter as claimed in claim 1 and wherein the switch means includes a plurality of single pole single throw switches coupled in pairs for interchanging said pairs, switches in each of said pairs being energised by complementary switching signals.

4. An RMS converter as claimed in claim 3 and wherein each switch comprises a Field Effect Transistor.

5. An RMS converter as claimed in claim 1 and wherein the alternating repetition interchange rate is of the order of 10 Hz.

6. An RMS converter as claimed in claim 1 and including an analogue to digital converter wherein the alternating repetition interchange rate is synchronised with measurement cycle of the analogue to digital converter.

* * * * *